(12) United States Patent
Higo et al.

(10) Patent No.: US 8,976,578 B2
(45) Date of Patent: Mar. 10, 2015

(54) MEMORY ELEMENT AND MEMORY APPARATUS

(71) Applicant: Sony Corporation, Tokyo (JP)

(72) Inventors: Yutaka Higo, Kanagawa (JP); Masanori Hosomi, Tokyo (JP); Hiroyuki Ohmori, Kanagawa (JP); Kazuhiro Bessho, Kanagawa (JP); Tetsuya Asayama, Tokyo (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 305 days.

(21) Appl. No.: 13/675,725

(22) Filed: Nov. 13, 2012

(65) Prior Publication Data

US 2013/0163316 A1 Jun. 27, 2013

(30) Foreign Application Priority Data

Nov. 30, 2011 (JP) ................................. 2011-261521

(51) Int. Cl.
*G11C 11/00* (2006.01)
*G11C 11/16* (2006.01)

(52) U.S. Cl.
CPC ........... *G11C 11/161* (2013.01); *Y10S 977/933* (2013.01); *Y10S 977/935* (2013.01)
USPC ........... 365/158; 365/148; 365/171; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, E21.665; 438/3; 977/933–935
See application file for complete search history.

(56) References Cited

U.S. PATENT DOCUMENTS

| 8,120,950 B2* | 2/2012 | Fukami et al. | 365/173 |
| 8,503,222 B2* | 8/2013 | Suzuki et al. | 365/158 |
| 2011/0002163 A1* | 1/2011 | Fukami et al. | 365/173 |
| 2011/0292718 A1* | 12/2011 | Suzuki et al. | 365/158 |
| 2012/0056284 A1* | 3/2012 | Higo et al. | 257/421 |
| 2013/0113058 A1* | 5/2013 | Fukami et al. | 257/421 |

FOREIGN PATENT DOCUMENTS

JP 2003-017782 1/2003

* cited by examiner

*Primary Examiner* — Harry W Byrne
(74) *Attorney, Agent, or Firm* — Rader, Fishman & Grauer PLLC

(57) ABSTRACT

A memory element has a layered configuration, including a memory layer in which a magnetization direction is changed corresponding to information; the magnetization direction being changed by applying a current in a lamination direction of the layered configuration to record the information in the memory layer, a magnetization-fixed layer in which a magnetization direction is fixed, an intermediate layer that is formed of a non-magnetic material and is provided between the memory layer and the magnetization-fixed layer, and a perpendicular magnetic anisotropy inducing layer, the memory layer including a first ferromagnetic layer, a first bonding layer, a second ferromagnetic layer, a second bonding layer and a third ferromagnetic layer laminated in the stated order.

6 Claims, 11 Drawing Sheets

MEMORY ELEMENT AND MEMORY APPARATUS

BACKGROUND

The present technology relates to a memory element and a memory apparatus that have a plurality of magnetic layers and make a record using a spin torque magnetization switching.

Along with a rapid development of various information apparatuses from mobile terminals to large capacity servers, further high performance improvements such as higher integration, increases in speed, and lower power consumption have been pursued in elements such as a memory element and a logic element configuring the apparatuses.

In particular, a semiconductor non-volatile memory has significantly progressed, and, as a large capacity file memory, flash memory is spreading at such a rate that hard disk drivers are replaced with the flash memory.

Meanwhile, the development of a semiconductor non-volatile memory has progressed as a substitute for the current NOR flash memory, DRAM or the like in general use, in order to use them for code storage or as a working memory. Examples include FeRAM (Ferroelectric Random Access Memory), MRAM (Magnetic Random Access Memory), PCRAM (Phase-Change Random Access Memory), or the like. A part of these is already in practical use.

Among these non-volatile memories, the MRAM performs the data storage using a magnetization direction of a magnetic material so that high speed and nearly unlimited ($10^{15}$ times or more) rewriting can be made, and therefore the MRAM has already been used in fields such as industrial automation and an airplane.

The MRAM has been expected to be expanded to code storage or working memory in the near future due to the high-speed operation and reliability.

However, the MRAM has challenges related to lowering power consumption and increasing capacity.

This is a basic problem caused by the recording principle of MRAM, that is, the method of switching the magnetization using a current magnetic field generated from an interconnection.

As a method of solving this problem, a recording method not using the current magnetic field (that is, a magnetization switching method) is under review. In particular, research on a spin torque magnetization switching has been actively made (for example, see Japanese Unexamined Patent Application Publication No. 2003-17782 and U.S. Pat. No. 5,695,864).

The memory element using a spin torque magnetization switching includes an MTJ (Magnetic Tunnel Junction) similarly as the MRAM.

This uses a phenomenon in which, when spin-polarized electrons passing through a magnetic layer which is fixed in an arbitrary direction enter another free (the direction is not fixed) magnetic layer, a torque is applied to the magnetic layer, and the free magnetic layer (the memory layer) is switched when a current having a predetermined threshold value or more flows. The rewriting of 0/1 is performed by changing the polarity of the current.

An absolute value of a current for the switching of the free magnetic layer is 1 mA or less in the case of a memory element with a scale of approximately 0.1 μm. In addition, since this current value decreases in proportion to a volume of the memory element, scaling is possible.

In addition, since a word line necessary for the generation of a recording current magnetic field in the MRAM is not necessary, there is an advantage that a cell structure becomes simple.

Hereinafter, the MRAM utilizing a spin torque magnetization switching will be referred to as a Spin Transfer Torque-Magnetic Random Access Memory (STT-MRAM).

Great expectations are put on the STT-MRAM as a non-volatile memory capable of realizing lower power-consumption and larger capacity while maintaining the advantages of the MRAM in which high speed and nearly unlimited rewriting may be performed.

SUMMARY

In the STT-MRAM, the spin torque inducing the magnetization switching changes its magnitude depending on the magnetization direction.

In the typical configuration of the STT-MRAM memory element, there is a magnetization angle where the spin torque becomes zero.

When the magnetization angle in an initial state is matched to the magnetization angle where the spin torque becomes zero, it takes a considerable amount of time to switch the magnetization direction. Accordingly, the magnetization switching may not be completed within a writing time.

If the switching does not completed within the writing time, the writing operation may result in a fail (a writing error) and will not be performed correctly.

It is desirable to provide a memory element and a memory apparatus that effectively inhibit occurrence of an error and perform writing operation in a short time.

According to an embodiment of the present technology, a memory apparatus is configured as described below.

In other words, the memory apparatus has a layered configuration, including a memory layer in which a direction of a magnetization is changed corresponding to information, a magnetization-fixed layer in which a magnetization direction is fixed, an intermediate layer that is formed of a non-magnetic material and is provided between the memory layer and the magnetization-fixed layer and a perpendicular magnetic anisotropy inducing layer, in which the information is recorded by applying a current in a lamination direction of the layered configuration to change the magnetization direction of the memory layer.

The memory layer includes a first ferromagnetic layer, a first bonding layer, a second ferromagnetic layer, a second bonding layer and a third ferromagnetic layer laminated in the stated order, the first ferromagnetic layer is contacted with the intermediate layer, the third ferromagnetic layer is contacted with the perpendicular magnetic anisotropy inducing layer, the ferromagnetic layers adjacent via the bonding layers are magnetically coupled via the bonding layers so that the magnetization direction of the ferromagnetic layer is inclined from a direction perpendicular to a film face.

The memory apparatus according to the embodiment of the present technology includes an interconnection that supplies a current flowing from the lamination direction to the memory apparatus and a current supply controller that controls the supply of current to the memory apparatus via the interconnection.

In the memory apparatus according to the embodiment of the present technology, the memory layer has the configuration that the three ferromagnetic layers are laminated via the bonding layers. Two ferromagnetic layers adjacent are bonded magnetically via the bonding layer inserted therebetween. Among these ferromagnetic layers, in the ferromagnetic layer contacted with the perpendicular magnetic anisotropy inducing layer, perpendicular magnetic anisotropy is induced by the perpendicular magnetic anisotropy inducing layer so that an easy axis of magnetization can be perpendicular to a film face. Similarly, among the ferromagnetic layers, in the ferromagnetic layer contacted with the intermediate layer, perpendicular magnetic anisotropy is induced by the intermediate layer so that an easy axis of magnetization can be perpendicular to a film face.

In the present technology, the magnetization direction of the ferromagnetic layer constituting the memory layer is inclined from a direction perpendicular to the film face. This can effectively inhibit divergence of the magnetization switching time caused by the fact that the directions of the magnetization of the memory layer and the magnetization-fixed layer are nearly parallel or non-parallel. In other words, the magnetization direction of the memory layer can be switched within a predetermined finite time to write information.

According to the memory apparatus of an embodiment of the present technology, a current can flow to the memory element in a lamination direction through the interconnection, and information can be recorded by the magnetization switching of the memory layer.

According to the present technology, the information can be written by switching the magnetization direction of the memory layer within a predetermined time, whereby a writing error can be decreased and a writing operation can be conducted in a shorter time.

Since the writing error can be decreased, the writing operation can have increased reliability.

In addition, the writing operation can be conducted in a shorter time, thereby realizing high-speed operation.

Accordingly, the present technology can realize the memory element and the memory apparatus having high reliability in the writing operation that can operate at high speed.

These and other objects, features and advantages of the present technology will become more apparent in light of the following detailed description of best mode embodiments thereof, as illustrated in the accompanying drawings.

DETAILED DESCRIPTION OF EMBODIMENTS

The embodiments of the present technology will be described in the following order.
<1. Schematic Configuration of Memory Apparatus According to Embodiment>
<2. General Description of Memory Element According to Embodiment>
<3. Concrete Configuration of Memory Element According to Embodiment>
<4. Simulation Results>
<5. Alternative>
<1. Schematic Configuration of Memory Apparatus According to Embodiment>

Firstly, a schematic configuration of a memory apparatus will be described.

Figure 1:
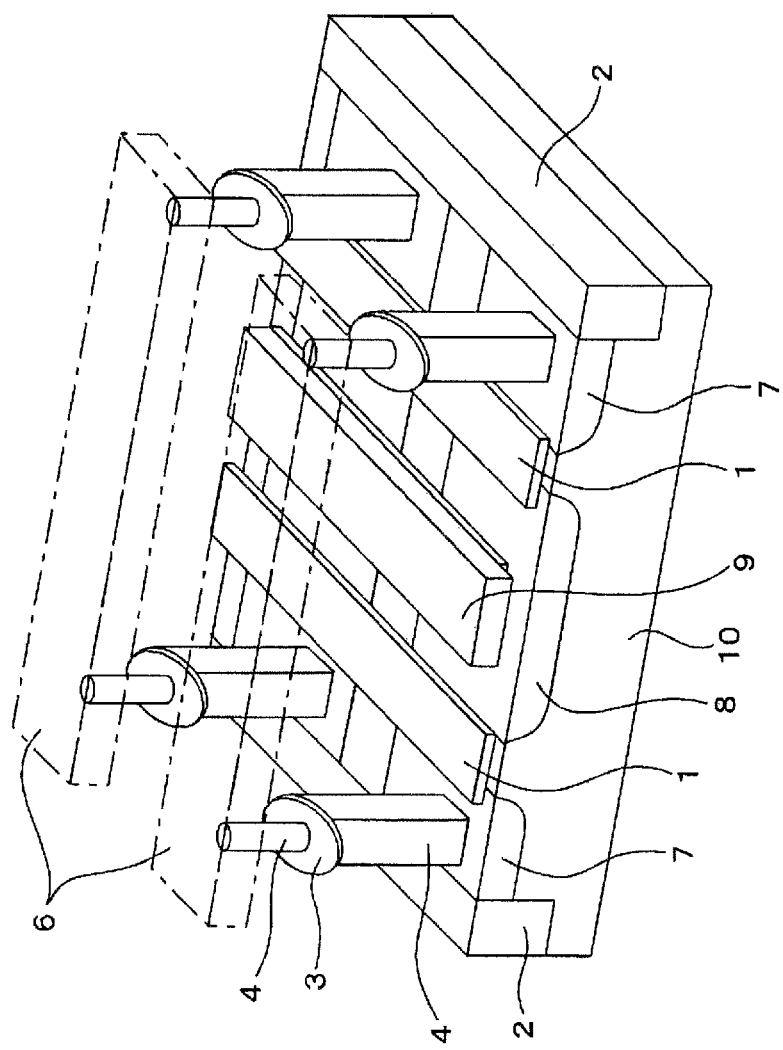
FIG. 1 a schematic perspective view of a memory apparatus according to an embodiment.
Figure 2:
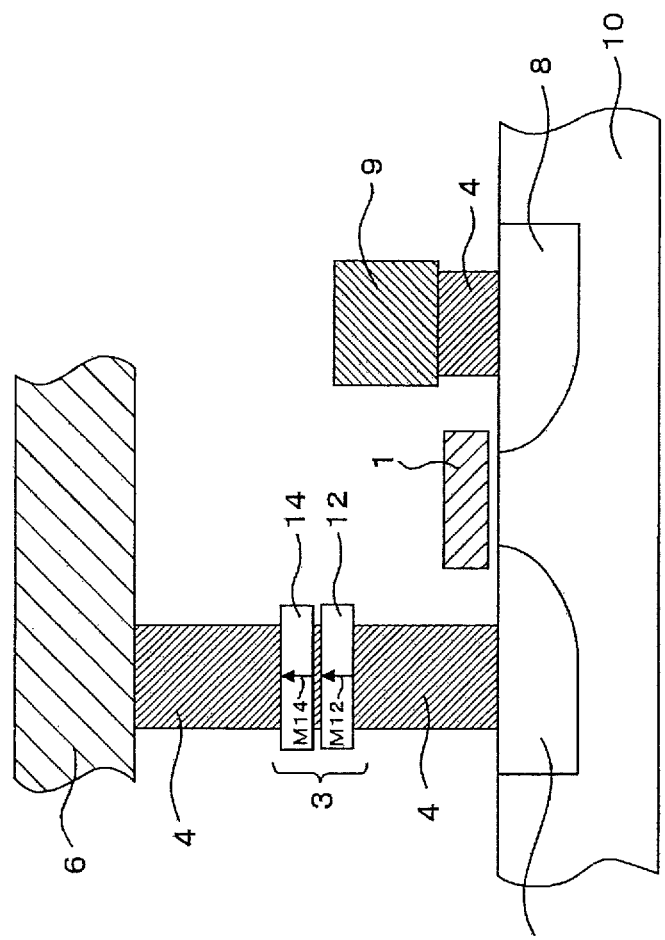
FIG. 2 is a cross-sectional view of a memory apparatus according to the embodiment.
Figure 3:
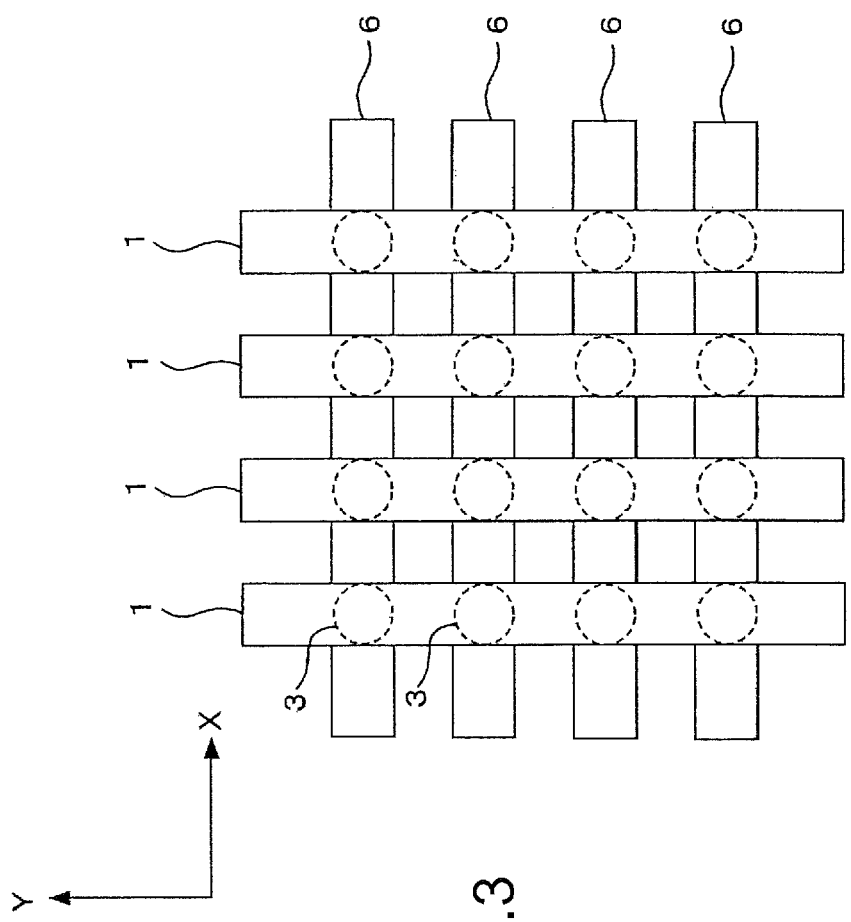
FIG. 3 is a plan view of a memory apparatus according to the embodiment.

FIGS. 1, 2 and 3 each show a schematic diagram of the memory apparatus. FIG. 1 is a perspective view, FIG. 2 is a cross-sectional view and FIG. 3 is a plan view.

As shown in FIG. 1, in the memory apparatus according to an embodiment, a memory element 3 including a Spin Transfer Torque-Magnetic Random Access Memory (STT-MRAM) that can hold information depending on a magnetization state is disposed in the vicinity of an intersection of two kinds of address interconnections (for example, a word line and a bit line) that are perpendicular with each other.

In other words, a drain region 8, a source region 7, and a gate electrode 1 that make up a selection transistor for the selection of each memory element 3 are formed in a semiconductor substrate 10, such as a silicon substrate, at portions isolated by an element isolation layer 2. Among them, the gate electrode 1 functions also as an address interconnection (a word line) extending in the front-back direction in FIG. 1.

The drain region 8 is formed commonly with right and left selection transistors in FIG. 1, and an interconnection 9 is connected to the drain region 8.

The memory element 3 having a memory layer that switch a direction of magnetization by a spin torque magnetization switching is disposed between the source region 7 and a bit line 6 that is disposed at an upper side and extends in the right-left direction in FIG. 1. The memory element 3 is configured with, for example, a magnetic tunnel junction element (MTJ element).

As shown in FIG. 2, the memory element 3 has two magnetic layers 12 and 14. In the two magnetic layers 12 and 14, one magnetic layer is set as a magnetization-fixed layer 12 that a direction of the magnetization M12 is fixed, and the other side magnetic layer is set as a magnetization-free layer in which that the direction of the magnetization M14 varies, that is, a memory layer 14.

In addition, the memory element 3 is connected to each bit line 6 and the source region 7 through upper and lower contact layers 4, respectively.

In this manner, when a current in the vertical direction (in a lamination direction) is applied to the memory element 3 through the two types of address interconnections 1 and 6, the direction of the magnetization M14 of the memory layer 14 can be switched by a spin torque magnetization switching.

As shown in FIG. 3, the memory apparatus is configured by disposing the memory elements 3 at intersections of a number of first interconnections (word lines) 1 and second interconnections (bit lines) 6 that are disposed perpendicularly in matrices.

The memory element 3 has a planar circular shape and a cross-section shown in FIG. 2.

Also, the memory element 3 has a magnetization-fixed layer 12 and a memory layer 14.

Each memory element 3 configures a memory cell of the memory apparatus.

In such a memory apparatus, it is necessary to perform writing with a current equal to or less than the saturation current of the selection transistor, and it is known that the saturation current of the transistor decreases along with miniaturization. In order to miniaturize the memory apparatus, it is desirable that spin transfer efficiency be improved and the current flowing to the memory element 3 be decreased.

In addition, it is necessary to secure a high magnetoresistance change ratio to amplify read-out signal. In order to realize this, it is effective to adopt the above-described MTJ structure, that is, to configure the memory element 3 in such a manner that an intermediate layer is disposed between the two magnetic layers 12 and 14 as a tunnel insulating layer (tunnel barrier layer).

In the case where the tunnel insulating layer is used as the intermediate layer, the amount of the current flowing to the memory element 3 is restricted to prevent the insulation breakdown of the tunnel insulating layer from occurring. That is, the current necessary for the spin torque magnetization switching has to be restricted from the viewpoint of securing reliability with respect to a repetitive writing of the memory element 3. The current necessary for the spin torque magnetization switching is also called as switching current, memory current or the like.

Since the memory apparatus according to the embodiment is a non-volatile memory, it is necessary to stably store the information written by a current. That is, it is necessary to secure stability (thermal stability) with respect to thermal fluctuations in the magnetization of the memory layer 14.

In the case where the thermal stability of the memory layer 14 is not secured, a direction of switched magnetization may be re-switched due to heat (temperature in an operational environment), which results in a holding error.

The memory element 3 (STT-MRAM) in the memory apparatus is advantageous in scaling compared to the MRAM in the related art, that is, advantageous in that the volume can be small. However, as the volume is small, the thermal stability may be deteriorated as long as other characteristics are the same.

As the capacity increase of the STT-MRAM proceeds, the volume of the memory element 3 becomes smaller, such that it is important to secure the thermal stability.

Therefore, in the memory element 3 of the STT-MRAM, the thermal stability is a significantly important characteristic, and it is necessary to design the memory element in such a manner that the thermal stability thereof is secured even when the volume is decreased.

<2. General Description about Memory Element According to Embodiment>

Then, a general description about the memory element 3 according to the embodiment will be described.

Firstly, referring to the cross-sectional view of FIG. 4, a schematic configuration of a memory element 3' in the STT-MRAM in the related art will be described in which the magnetization direction of the memory layer (the magnetization direction in an equilibrium state) is perpendicular to the film face.

As will become apparent from the following description, in the memory element 3 according to the embodiment of the present technology, the direction of the magnetization M14 of the memory layer 14 (the direction of the magnetization M14 in an equilibrium state) will not be perpendicular to the film face. In the description referring to FIG. 4, the memory layer "14" of the memory element 3' will be used as a matter of convenience.

Figure 4:
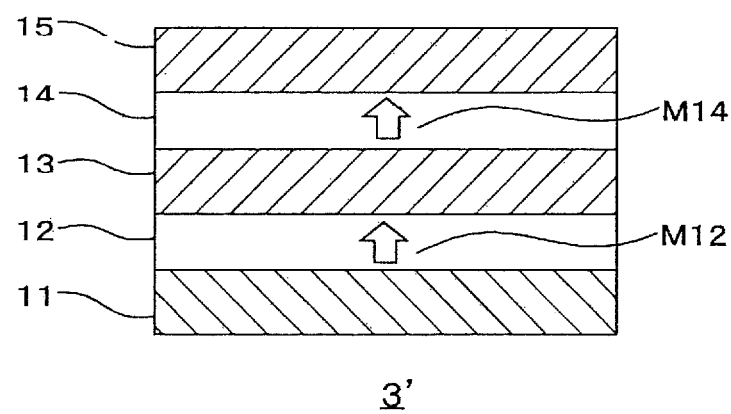
FIG. 4 is a cross-sectional view for illustrating a schematic configuration of an STT-MRAM memory element in the related art where a magnetization direction is perpendicular to a film face.

As shown in FIG. 4, in the memory element 3', a magnetization-fixed layer (also referred to as a reference layer) 12 in which a direction of magnetization M12 is fixed, an intermediate layer (non-magnetic layer: tunnel insulating layer) 13, a memory layer (free magnetization layer) 14 in which the direction of the magnetization M14 is variable and a cap layer 15 are laminated on an underlying layer 11 in the stated order.

Of these, in the magnetization-fixed layer 12, the direction of the magnetization M12 is fixed by high coercive force or the like. In this case, the magnetization direction of the magnetization-fixed layer 12 is fixed to in a direction perpendicular to the film face.

In the memory element 3', information is stored by the direction of the magnetization M14 (magnetic moment) of the memory layer 14 having uniaxial anisotropy.

Information is written into the memory element 3' by applying a current to in a direction perpendicular to the film face of each layer of the memory element 3' (in other words, a lamination direction of each layer) to induce a spin torque magnetization switching in the memory layer 14.

Here, the spin torque magnetization switching will be briefly described.

For electrons there are two possible values for spin angular momentum. The states of the spin are defined temporarily as up and down. The numbers of up spin angular momentum electrons and down spin angular momentum electrons are the same in the non-magnetic material. But the numbers of up spin and down spin electrons are different in the ferromagnetic material.

Firstly, in two ferromagnetic layers (the magnetization-fixed layer 12 and the memory layer 14) laminated via the intermediate layer 13, the case will be considered where the directions of magnetization M12 and M14 are non-parallel and the electrons are moved from the magnetization-fixed layer 12 to the memory layer 14.

The electrons passed through the magnetization-fixed layer 12 are spin polarized, that is, the numbers up spin and down spin electrons are different.

When the thickness of the intermediate layer 13 as the tunnel barrier layer is made to be sufficiently thin, the electrons reach the other magnetic material, that is, the memory layer (free magnetic layer) 14 before the spin polarization is mitigated and the electrons become a common non-polarized state in a non-polarized material (the numbers up spin and down spin electrons are the same).

A sign of the spin polarization in the two ferromagnetic layers (the magnetization-fixed layer 12 and the memory layer 14) is reversed so that a part of the electrons is switched for lowering the system energy, that is, the direction of the spin angular momentum is changed. At this time, the entire angular momentum of the system is necessary to be conserved so that a reaction equal to the total angular momentum change by the electron, the direction of which is changed, is applied to magnetization M14 of the memory layer 14.

In the case where the current, that is, the number of electrons passed through per unit time is small, the total number of electrons, the directions of which, are changed becomes small so that the change in the angular momentum occurring in the magnetization M14 of the memory layer 14 becomes small, but when the current increases, it is possible to apply large change in the angular momentum within a unit time.

The time change of the angular momentum with is a torque, and when the torque exceeds a threshold value, the magnetization M14 of the memory layer 14 starts a precession, and rotates 180 degrees due to uniaxial anisotropy of the memory layer 14 to be stable. That is, the switching from the non-parallel state to the parallel state occurs.

On the other hand, when the directions of magnetization M12 and M14 of the two ferromagnetic layers are parallel and the electrons are made to reversely flow from the memory layer 14 to the magnetization-fixed layer 12, the electrons are then reflected at the magnetization-fixed layer 12.

When the electrons that are reflected and spin-switched enter the memory layer 14, a torque is applied and the direction of the magnetization M14 of the memory layer 14 is switched so that it is possible to switch the magnetization M12 and M14 to the non-parallel state.

However, at this time, the amount of the current necessary for causing the switching is larger than that in the case of switching from the non-parallel state to the parallel state.

The switching from the parallel state to the non-parallel state is difficult to intuitively understand, but it may be considered that the magnetization M12 of the magnetization-fixed layer 12 is fixed such that the magnetic moment is not switched, and the memory layer 14 is switched for conserving the angular momentum of the entire system.

As described above, the recording of 0/1 is performed by applying a current having a predetermined threshold value or more, which corresponds to each polarity, from the magnetization-fixed layer (reference layer) 12 to the memory layer 14 or in a reverse direction thereof.

Reading of information is performed by using a magnetoresistive effect similarly to the MRAM in the related art. That is, as is the case with the above-described recording, a current is applied in a direction perpendicular to the film face (in the lamination direction of each layer). Then, a phenomenon in which an electrical resistance shown by the memory element 3 varies depending on whether or not the direction of the magnetization M14 of the memory layer 14 is parallel or non-parallel to the direction of the magnetization M12 of the magnetization-fixed layer (reference layer) 12 is used.

A material used for the intermediate layer 13 as the tunnel insulating layer may be a metallic material or an insulating material, but the insulating material may be used for the intermediate layer 13 to obtain a relatively high read-out signal (resistance change ratio), and to realize the recording by a relatively low current. The element at this time is called a ferromagnetic tunnel junction (Magnetic Tunnel Junction: MTJ) element.

The above-described spin torque changes by an angle between the direction of the magnetization M14 of the memory layer 14 and the direction of the magnetization M12 of the magnetization-fixed layer (reference layer) 12.

When a unit vector representing the direction of the magnetization M14 is specified as m1 and a unit vector representing the direction of the magnetization M12 is specified as m2, a magnitude of the spin torque is proportional to m1×(m1× m2). Herein, "×" means a cross product of the vectors.

In general, the magnetization M12 of the magnetization-fixed layer 12 is fixed to the easy axis of magnetization of the memory layer 14. The magnetization M14 of the memory layer 14 has a tendency to direct the easy axis of magnetization of the memory layer 14 itself. In this case, m1 and m2 are at 0 degree (parallel) or 180 degrees (non-parallel).

FIG. 4 illustrates the direction of the magnetization M14 and the direction of the magnetization M12 when m1 and m2 are at 0 degree.

Thus, when m1 and m2 are at 0 degree or 180 degrees, the spin torque will not work at all according to the above-described spin torque equation.

However, in practice, as the magnetization M14 of the memory layer 14 is randomly distributed around the easy axis of magnetization of the memory layer 14 due to thermal fluctuations, the spin torque works to induce the magnetization switching, once the angle between the magnetization M14 of the memory layer 14 and the magnetization M12 of the memory layer 12 deviates from 0 degree or 180 degrees.

A magnetic material has magnetic energy following the magnetization direction. In the direction of the lowest magnetic energy, there is the easy axis of magnetization.

When there are no thermal fluctuations, the magnetization is directed to the easy axis of magnetization by a force (torque) for minimizing the magnetic energy.

On the other hand, the magnetic energy becomes higher, when the magnetization direction is away from the easy axis of magnetization due to the thermal fluctuations, as compared with when the magnetization is in the easy axis of magnetization. Such a difference is referred to as excitation energy E. As the magnetization direction is further away from the easy axis of magnetization and the excitation energy E exceeds a predetermined threshold value, the magnetization switching occurs.

The threshold value is referred to as $\Delta$.

The $\Delta$ is considered as energy necessary to switch the magnetization. Although the units of the excitation energy E and the threshold value A are in Joule (J), these are hereinafter treated as dimensionless quantity divided by thermal energy (a product of the Boltzmann constant and the absolute temperature). Thus, since the $\Delta$ is considered as a magnetization stability index, the $\Delta$ may be referred to as a thermal stability index.

Using the excitation energy E of the magnetization M14 of the memory layer 14 and the index $\Delta$ of thermal stability, current I flowing the memory layer 14 and a time (switching time) ts necessary for the spin torque magnetization switching caused by the current I are represented by the following equation:

[Equation 1]

$$\frac{\eta(I - I_{c0})t_s}{e} = \left(\frac{M_s V}{\mu B}\right)\ln\left(\frac{\pi}{2}\sqrt{\frac{\Delta}{E}}\right) \qquad [\text{式} 1]$$

where Ic0 represents a threshold value current necessary for the spin torque magnetization switching, η represents a spin polarization ratio of the current I, e represents an electron charge, Ms represents saturation magnetization of the magnetization M14, V represents a volume of the memory layer 14 and μB represents Bohr magnetron.

The left-hand side corresponds to the number of spins injected into the memory layer 14. The right-hand side corresponds to the number of the spins in the memory layer 14. In this regard, the number is scaled by a logarithmic term. The excitation energy E is of the direction of magnetization at the time of applying a current.

Using the above [Equation 1], the switching time ts will be described when a predetermined amount of current I flows.

The higher the excitation energy E is, the smaller the right-hand side is. (Note that the E will not exceed the Δ.) So, the switching time ts becomes short, too.

Conversely, as the excitation energy E approaches to zero, the right-hand side diverges infinitely, and the switching time ts also diverges infinitely. When there are no thermal fluctuations, the excitation energy E becomes zero, and the switching time ts therefore diverges.

Here, when there are the thermal fluctuations, the excitation energy E will be described. By the thermal fluctuations, the excitation energy E becomes a finite value. In the case where the memory layer 14 is configured with the single ferromagnetic layer, the probability that the excitation energy E becomes smaller than a predetermined value X is given as 1-exp(−X).

From [Equation 1], the excitation energy E necessary to switch in the switching time ts when predetermined current I flows is considered to as X. Then, when the predetermined current I flows only for the time ts, the magnetization switching will not occur with the probability 1-exp(−X). In other words, the writing error rate will be 1-exp(−X).

As described above, the excitation energy E is intimately related with the writing error rate.

According to the present technology, in order to inhibit divergence of the above-described switching time, the memory layer 14 has a configuration that three ferromagnetic layers are laminated via two bonding layers. Two ferromagnetic layers adjacent are bonded magnetically via the bonding layer therebetween.

By the configuration of the present technology, the magnetic bonding between the ferromagnetic layers of the memory layer can incline the directions of magnetization of the ferromagnetic layers from a direction perpendicular to a film face. It can inhibit divergence of the time necessary for the magnetization switching to be almost parallel or non-parallel of the directions of magnetization of the memory layer and the magnetization-fixed layer.

This allows the information to be written by switching the magnetization direction of the memory layer within a predetermined finite time.

<3. Concrete Configuration of Memory Element According to Embodiment>

The specific embodiments of the present technology will be described below.

Figure 5:
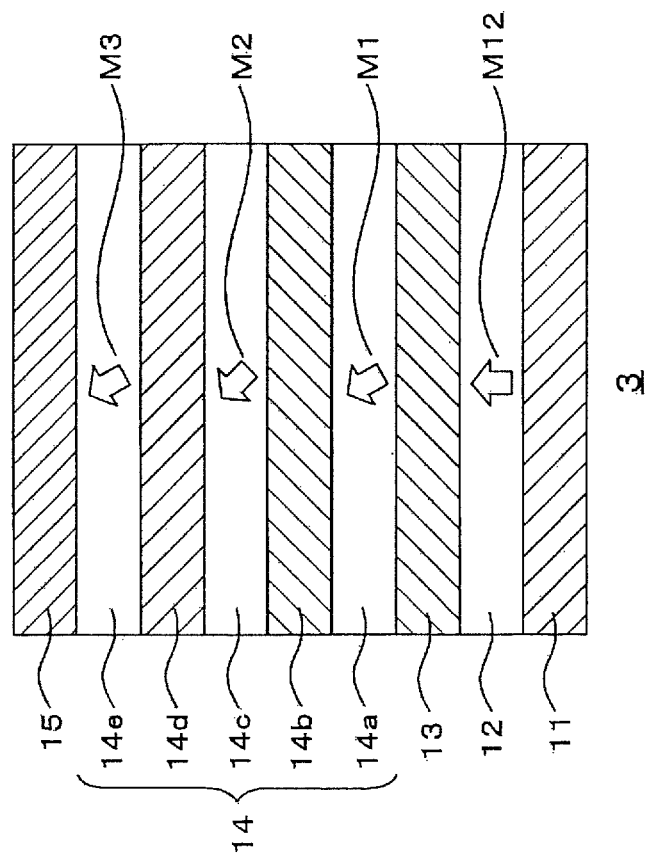
FIG. 5 is a schematic configuration cross-sectional view of a memory element according to the embodiment.

FIG. 5 shows a schematic configuration view (cross-sectional view) of the memory element 3 according to the embodiment.

In the description below, a description is omitted as to the parts that are the same as the parts already described by attaching the same signs.

As shown in FIG. 5, in the memory element 3 according to the embodiment, a magnetization-fixed layer (reference layer) 12 in which a direction of magnetization M12 is fixed, an intermediate layer (non-magnetic layer: tunnel insulating layer) 13, a memory layer (free magnetization layer) 14 in which the direction of the magnetization M14 is variable and a cap layer 15 are laminated on an underlying layer 11 in the stated order.

As described above, in the magnetization-fixed layer 12, the direction of the magnetization M12 is fixed in a direction perpendicular to the film face (upward in FIG. 5).

The memory element 3 according to the embodiment is different from the former memory element 3' in that the configuration of the memory layer 14 is changed to have a multilayer configuration including the ferromagnetic layers and the bonding layers.

Specifically, the memory layer 14 has a five-layered configuration in which a ferromagnetic layer 14a, a bonding layer 14b, a ferromagnetic layer 14c, a bonding layer 14d and a ferromagnetic layer 14e are laminated in the stated order.

In the embodiment, the cap layer 15 is configured with a perpendicular magnetic anisotropy inducing layer. Specifically, the cap layer 15 is composed of an oxide (more specifically, MgO) to function as the perpendicular magnetic anisotropy inducing layer to the ferromagnetic layer disposed thereunder.

In the embodiment, although the perpendicular magnetic anisotropy inducing layer and the cap layer are configured as a common layer, it should be appreciated that these layers can be configured as separate layers.

Hereinafter, the cap layer 15 and "the perpendicular magnetic anisotropy inducing layer 15" are used interchangeably.

In the embodiment, the intermediate layer 13 is also configured with the perpendicular magnetic anisotropy inducing layer. Specifically, the intermediate layer 13 is also composed of an oxide (more specifically, MgO) to function as the perpendicular magnetic anisotropy inducing layer to the ferromagnetic layer disposed thereover.

In this case, the ferromagnetic layer 14e positioned at an uppermost side is contacted with the cap layer 15 which is the perpendicular magnetic anisotropy inducing layer at an interface opposite to an interface between the bonding layer 14d and the ferromagnetic layer 14e.

The ferromagnetic layer 14a positioned at a lowermost side is contacted with the intermediate layer 13 which is the perpendicular magnetic anisotropy inducing layer at an interface opposite to an interface between the bonding layer 14b and the ferromagnetic layer 14e.

In addition, the magnetization M1 of the ferromagnetic layer 14a positioned at a lowermost side and the magnetization M2 of the ferromagnetic layer 14c are magnetically bonded via the bonding layer 14b. Similarly, the magnetization M2 of the ferromagnetic layer 14c and the magnetization M3 of the ferromagnetic layer 14e are magnetically bonded via the bonding layer 14d.

In the bonding layers 14b and 14d, non-magnetic metal such as Ta, Ru and the like can be used.

Among the respective ferromagnetic layers of the memory layer 14, a CoFeB layer having perpendicular magnetic anisotropy, which has been attracting attention in recent years, is used for the layers 14a and 14e.

When the CoFeB layer is contacted with the oxide at least one of the interfaces, the perpendicular magnetic anisotropy is induced by the oxide such that the easy axis of magnetization of the CoFeB layer is perpendicular to the film face.

According to the configuration of the memory element 3 described above, the ferromagnetic layer 14a is contacted with the intermediate layer 13 and the ferromagnetic layer 14e is contacted with the cap layer 15, whereby inducing the perpendicular magnetic anisotropy to these ferromagnetic layers 14a and 14e.

By using the oxide material as the material of the intermediate layer 13, relatively high read-out signal (resistance change ratio) can be provided, and it is possible to record at a relatively low current, as described above.

Among the respective ferromagnetic layers of the memory layer 14, a variety of magnetic materials used in the memory element of the STT-MRAM in the related art can be used for the middle ferromagnetic layer 14c.

For example, CoFeB can also be used similar to the ferromagnetic layers 14a and 14e.

Since the ferromagnetic layer 14c is contacted with the bonding layers 14b and 14d at both interfaces, the perpendicular magnetic anisotropy is not induced. In this case, the demagnetizing field is provided in a direction perpendicular to the film face, and the magnetization M2 of the ferromagnetic layer 14c is more stable at the film face direction.

A variety of magnetic materials used in the MTJ of the STT-MRAM in the related art can be used for the magnetization-fixed layer 12. For example, FePt, CoPt, TbFeCo, GdFeCo, CoPd, MnBi, MnGa, PtMnSb, CoFeB, Co—Cr based material and the like can be used. It is possible to use magnetic materials other than these materials.

A read-out of information is performed by using a magnetoresistive effect similarly to the memory element 3' in the related art. That is, as is the case with the above-described recording of information, current is applied in a direction perpendicular to the film face (in the lamination direction of each layer). Then, a phenomenon is used where an electrical resistance shown by the memory element 3 varies by a relative angle of the direction of the magnetization M12 of the magnetization-fixed layer 12 and the direction of the magnetization M14 of the memory layer 14.

Figure 6:
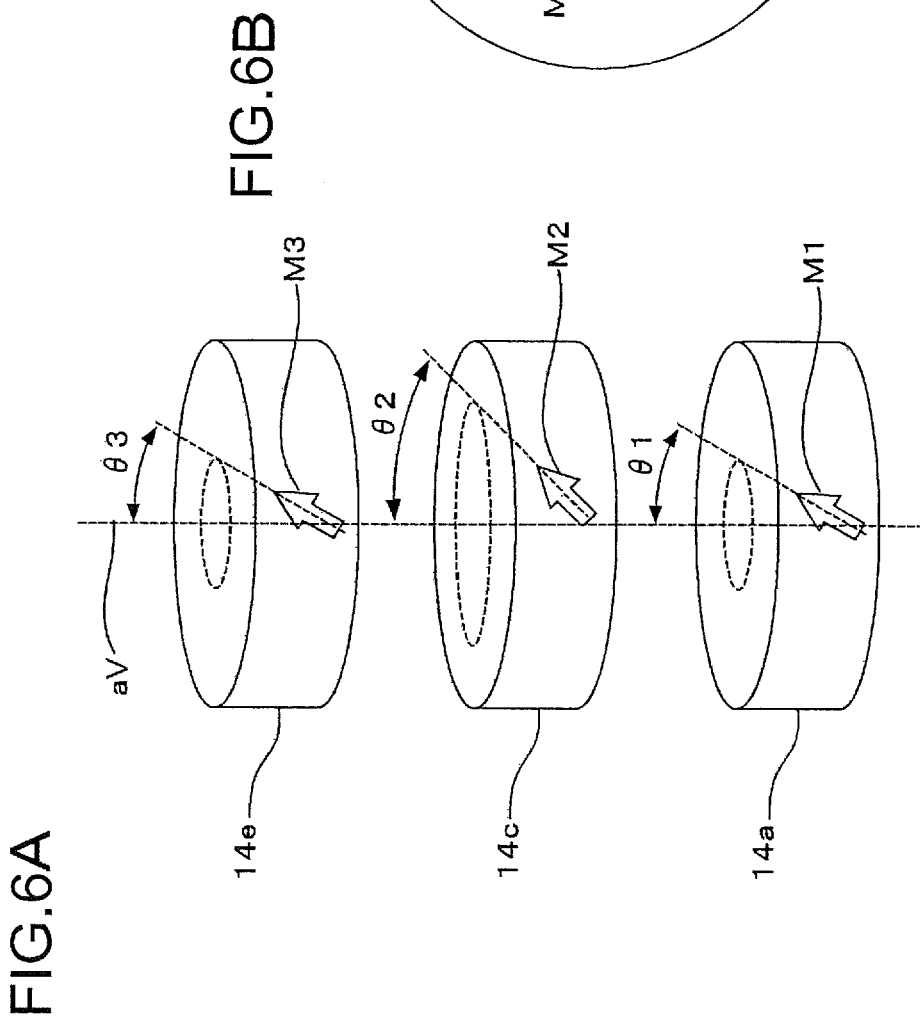
FIGS. 6A and 6B are schematic configuration perspective and plan views of a memory layer according to the embodiment.

FIGS. 6A and 6B are perspective and plan views for showing the configuration of the memory layer 14 in further detail. FIG. 6A is a perspective view of the memory layer 14, and FIG. 6B is a plan view of the memory layer 14. In FIGS. 6A and 6B, the bonding layers 14b and 14d are omitted for the sake of convenience.

In the memory element 3 according to the embodiment, the memory layer 14 has a cylindrical shape.

In order to describe the magnetization M1, M2 and M3 directions, angles $\theta 1$, $\theta 2$, $\theta 3$, $\phi 1$, $\phi 2$ and $\phi 3$ are defined.

In the perspective view of FIG. 6A, a perpendicular axis aV penetrating the memory layer 14 in a perpendicular direction is shown. The angle $\theta 1$ is formed by the magnetization M1 and the perpendicular axis aV, the $\theta 2$ is formed by the magnetization M2 and the perpendicular axis aV and $\theta 3$ is formed by the magnetization M3 and the perpendicular axis aV.

In the plan view of FIG. 6B, reference lines aH passing through centers of the ferromagnetic layers 14a, 14c and 14e are shown. As cross-sectional shapes of the ferromagnetic layers 14a, 14c and 14e are circle, directions of the reference line aH are selected arbitrarily. When the magnetizations M1, M2 and M3 are projected on the film face, the angle $\phi 1$ is formed by the reference line aH and the magnetization M1, the angle $\phi 2$ is formed by the reference line aH and the magnetization M2 and the angle $\phi 3$ is formed by the reference line aH and the magnetization M3.

As described above, a magnetic material has magnetic energy following the magnetization direction.

In order to describe the magnetic energy, the following values are defined.

In other words, an energy difference 11 is provided by subtracting the magnetic energy at the time the magnetization M1 is directed to the perpendicular direction ($\theta 1 = 0$ degree) from the magnetic energy at the time the magnetization M1 is directed to the face direction ($\theta 1 = 90$ degrees).

An energy difference $\Delta 2$ is provided by subtracting the magnetic energy at the time the magnetization M2 is directed to the perpendicular direction ($\theta 2 = 0$ degree) from the magnetic energy at the time the magnetization M2 is directed to the face direction ($\theta 2 = 90$ degrees).

An energy difference $\Delta 3$ is provided by subtracting the magnetic energy at the time the magnetization M3 is directed to the perpendicular direction ($\theta 3 = 0$ degree) from the magnetic energy at the time the magnetization M3 is directed to the face direction ($\theta 3 = 90$ degrees).

Magnetic binding energy intensity of the magnetization M1 and the magnetization M2 is defined as $\Delta 12$, and magnetic binding energy intensity of the magnetization M2 and the magnetization M3 is defined as $\Delta 23$.

Although the units of the $\Delta 1$, $\Delta 2$, $\Delta 3$, $\Delta 12$ and $\Delta 23$ are in Joule (J), these are hereinafter treated as dimensionless quantity divided by thermal energy (a product of the Boltzmann constant and the absolute temperature) similar to the excitation energy E and the threshold value $\Delta$ as described above.

Following the definition, in the memory layer 14 according to the embodiment, $\Delta 1$ is a positive sign, $\Delta 2$ is a negative sign and $\Delta 3$ is a positive sign. $\Delta 12$ and $\Delta 23$ may have either sign, provided that they are not zero.

Then, the magnetic energy $\epsilon$ of the memory layer 14 can be represented by the following [Equation 2]:

[Equation 2]

$$\varepsilon = \Delta_1 \sin^2\theta_1 + \Delta_2 \sin^2\theta_2 + \Delta_3 \sin^2\theta_3 - \Delta_{12}(\cos\theta_1\cos\theta_2 + \sin\theta_1\sin\theta_2\cos(\phi_1 - \phi_2)) - \Delta_{23}(\cos\theta_2\cos\theta_3 + \sin\theta_2\sin\theta_3\cos(\phi_2 - \phi_3)).$$ [式 2]

The excitation energy E of the memory layer 14 is represented by E=$\epsilon$-$\epsilon$min. The $\epsilon$min means a minimum value of the magnetic energy $\epsilon$.

Similar to the case of the memory layer 14 in the related art, when there are no thermal fluctuations, the magnetizations M1, M2 and M3 change their directions so that the excitation energy E becomes zero, i.e., the magnetic energy $\epsilon$ becomes min (the state is herein referred to as an "equilibrium state").

In the related art, when the memory layer 14 is composed of the single CoFeB layer, the perpendicular magnetic anisotropy is induced so that the magnetization direction becomes perpendicular to the film face. The relative angle of the magnetization of the memory layer 14 and the magnetization of the magnetization-fixed layer 12 becomes parallel (0 degree) or non-parallel (180 degrees). The spin torque therefore does not work and the switching time may be undesirably increased.

In contrast, as a result of intensive studies, it has been found that, in the configuration of the memory layer 14 according to the embodiment of the present technology, when the excitation energy E becomes 0 (i.e., in the equilibrium state), the angles of the magnetizations M1, M2 and M3 can be inclined to the direction of the magnetization M12 of the magnetization-fixed layer 12 (perpendicular axis) neither parallel (0 degree) nor non-parallel (180 degrees). It has been found that the finite spin torque works, and an increase in the switching time is inhibited under such circumstances.

As a result of intensive studies about the conditions that the magnetization direction is inclined using [Equation 2], it has been revealed that:

For the sake of convenience, in the following description, $\Delta 1$ and $\Delta 3$ are defined to have the same value $\Delta 1/2$ such that a sum of both becomes $\Delta 1$. Also, $\Delta 12$ and $\Delta 23$ are newly defined to have the same value $\Delta$ex.

Firstly, consider the case where both of the magnetic binding energy intensity of the magnetization M1 and the magnetization M2 and the magnetic binding energy intensity of the magnetization M2 and the magnetization M3 $\Delta$ex are 0, i.e., the magnetizations M1, M2 and M3 move independently each other.

Since $\Delta 1$ and $\Delta 3$ are positive, the easy axes of the magnetizations M1 and M3 become perpendicular to the film face, and the magnetizations M1 and M3 face perpendicular to the film face in the equilibrium state. On the other hand, since $\Delta 2$ is negative, the easy axis of the magnetization M2 becomes within the film face, and the magnetization M2 faces to the film face in the equilibrium state. In this case, the ferromagnetic layer 14c is isotropic to the rotation around the perpendicular axis aV and φ2 may have any value.

Next, consider the case according to the present technology that both of the magnetic binding energy intensity of the magnetization M1 and the magnetization M2 and the magnetic binding energy intensity of the magnetization M2 and the magnetization M3 Δex are not 0, i.e., the magnetizations M1, M2 and M3 move in combination with each other.

By the definition, when Δex is positive, the magnetization M1 and the magnetization M2, and the magnetization M2 and the magnetization M3 try to be parallel. On the other hand, when Δex is negative, the magnetization M1 and the magnetization M2, and the magnetization M2 and the magnetization M3 try to be non-parallel. The former may be referred to as ferromagnetic bonding, and the latter may be referred to as antiferromagnetic bonding.

For the sake of convenience, in the following description, the case when Δex is positive will be considered. However, the same consideration shall be true when Δex is negative.

Now, Δ1 (and Δ3) and Δ2 have different signs, the magnetization of the one ferromagnetic layer has the easy axis of magnetization perpendicular to the film face, and the magnetization of the other ferromagnetic layer has the easy axis of magnetization within the film face in the adjacent two ferromagnetic layers.

These two magnetizations having the directions competing against each other bond with Δex intensity.

If Δ1 and Δ3 are positive as well as Δ2, magnetization angle becomes parallel to the perpendicular angle aV not depending on the magnitude of Δex. So, an increase in the switching time is inevitable similar to the memory element 3' having the memory layer 14 as shown in FIG. 4.

On the other hand, if Δ1 and Δ3 are negative as well as Δ2, magnetization angle becomes within the film face not depending on the magnitude of Δex. So, a relative angle of the magnetization M1 of the ferromagnetic layer 14a and the magnetization M2 of the magnetization-fixed layer 12 becomes constant 90 degrees. As a resistance change due to magnetoresistive effect does not occur and information cannot be read-out, it will be not possible to be used as the memory element of the STT-MRAM.

As understood through this, in the memory element 3 of the embodiment, the sign of Δ2 should be different from those of Δ1 and Δ3.

Figure 7:
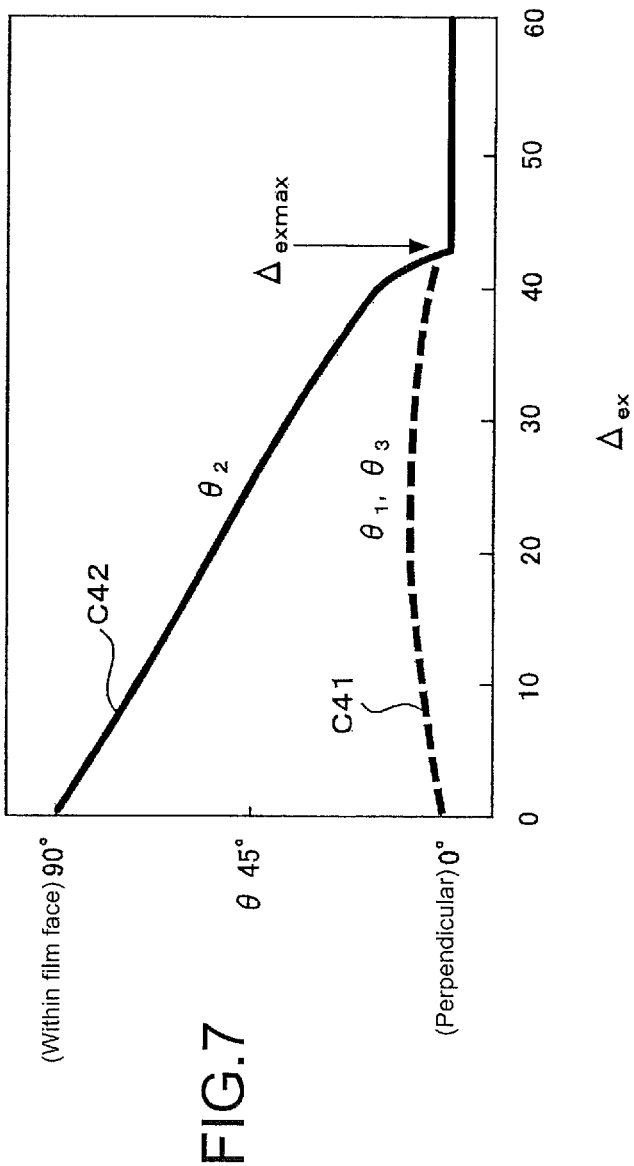
FIG. 7 is a plot of a relationship between magnetic binding energy among ferromagnetic layers and a magnetization angle in an equilibrium state.

FIG. 7 is a plot of a relationship between the binding intensity Δex and the magnetization direction in the equilibrium state, when Δ1 is fixed to 100 and Δ2 is fixed to −30.

A curve C41 corresponds to the magnetization M1 and the magnetization M3 and the angle θ1 and θ3 from the perpendicular axis aV, and a curve C42 corresponds to the magnetization M2 and the angle θ2 from the perpendicular axis aV.

As shown in FIG. 7, when Δex is larger than 0 and smaller than Δexmax, θ1, θ2 and θ3 are larger than 0. In the area, the magnetizations M1, M2 and M3 are inclined from the perpendicular axis aV.

Once Δex is equal to or higher than Δexmax, the force to line up the magnetizations is too high to become the magnetizations M1, M2 and M3 parallel to the perpendicular axis aV.

Next, in order to determine the upper limit of Δex, the upper limit Δexamax, where the magnetizations M1, M2 and M3 become parallel, to a variety of combinations of Δ1 and Δ2 was calculated using the former [Equation 2].

Figure 8:
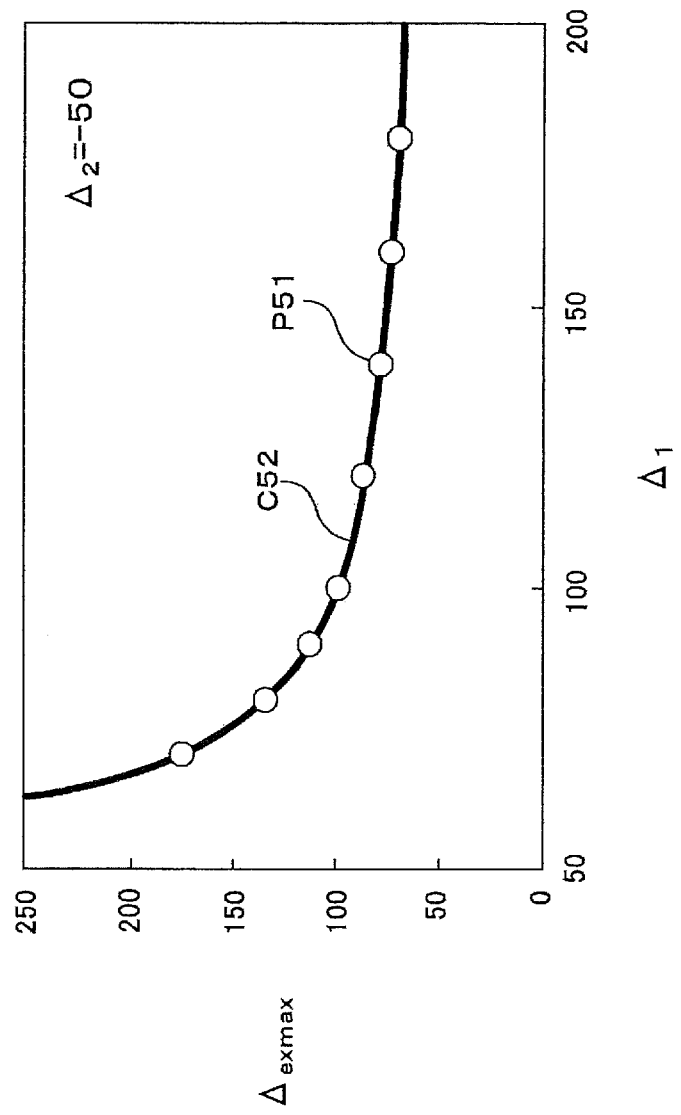
FIG. 8 is a plot of a relationship between magnetic energy of a ferromagnetic layer and maximum magnetic binding energy among ferromagnetic layers.

FIG. 8 shows an example of the result.

In FIG. 8, Δ2 is fixed to −50, and Δ1 is changed from 70 to 180. White circles P51 are the upper limit Δexmax of Δex. When Δex is smaller than the value, the magnetizations M1, M2 and M3 can be inclined.

By searching an equation that can be fit to a plurality of the white circles P51, the following equation is found to be fitted.

$$\Delta exmax = abs(\Delta 1 \times \Delta 2/(\Delta 1 + \Delta 2)) \qquad \text{[Equation 3]}$$

where abs is a function that returns the absolute value.

A curve C52 is obtained by plotting Equation 3.

Now, the case only when Δex is positive is considered. However, the same equation shall be true when Δex is negative.

Eventually, the condition that the magnetizations M1, M2 and M3 are inclined is derived from the above [Equation 3] as follows:

$$abs(\Delta ex) < abs(\Delta 1 \times \Delta 2/(\Delta 1 + \Delta 2)) \qquad \text{[Equation 4]}$$

In the meantime, the present inventors have been derived the condition that the directions of magnetization of these ferromagnetic layers become inclined to the perpendicular axis aV by the technique similar to the above-described technique, when the memory layer 14 has a three-layered configuration: a ferromagnetic layer/a binding layer/a ferromagnetic layer.

As a result, the range of Δex for inclining the magnetizations is derived as:

$$abs(\Delta ex) < abs(2 \times \Delta 1 \times \Delta 2/(\Delta 1 + \Delta 2))$$

From the result, it can be concluded that necessary Δex may be lower when the memory layer 14 according to the embodiment of the present technology has a five-layered configuration: a ferromagnetic layer/a binding layer/a ferromagnetic layer/a binding layer/a ferromagnetic layer as compared with the three-layered configuration: a ferromagnetic layer/a binding layer/a ferromagnetic layer.

Here as the magnitude of Δex is limited depending on the material and the thickness of the binding layer, the lower Δex is desirable. In this context, the memory layer 14 having the five-layered configuration according to the embodiment of the present technology may be desirable to incline the magnetizations.

In view of the above, the condition to incline the magnetization M1 and the magnetization M2 becomes apparent. When Δ1, Δ2, Δ3, Δex (Δ12, Δ23) satisfy the condition, there can be provided the memory layer 14 having the directions of magnetization inclined in the equilibrium state.

That is to say, the memory layer 14 according to the embodiment of the present technology is configured such that Δ2 has a sign different from those of Δ1 and Δ3, and Δ1, Δ2, Δ3 and Δex satisfy the condition of [Equation 4].

In the meantime, the excitation energy E of the memory layer 14 is provided by subtracting the magnetic energy in the equilibrium state from the magnetic energy shown in the former [Equation 2]. Furthermore, the excitation energy E for switching the magnetization M1 direction and the magnetization M2 direction is the thermal stability index Δ.

When the above-described Δ1, Δ2, Δ3 and Δex are provided, the excitation energy E and the thermal stability index Δ are uniquely determined.

Figure 9:
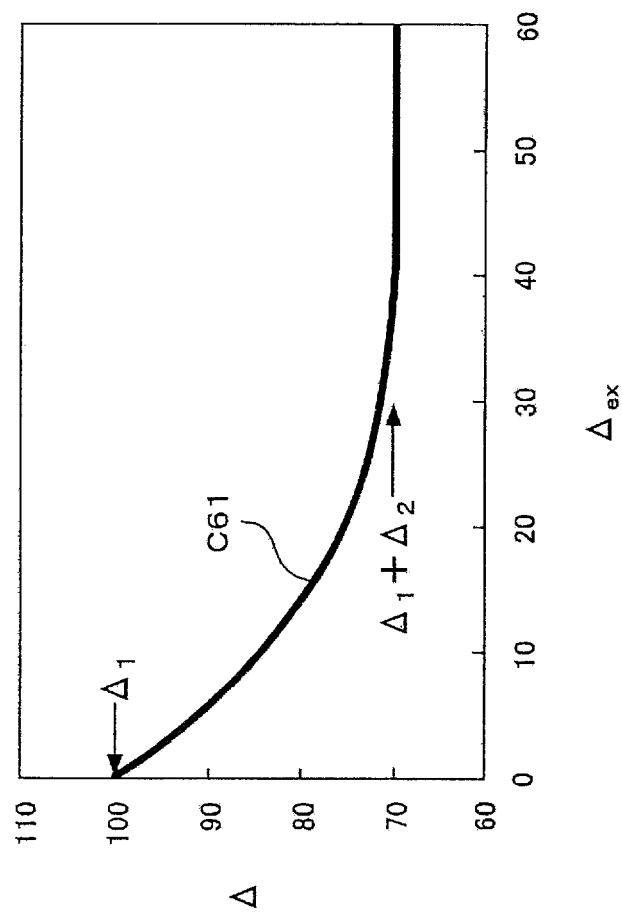
FIG. 9 is a plot of a relationship between magnetic binding energy among ferromagnetic layers and a thermal stability index.

FIG. 9 is a plot of a relationship between the magnetic binding energy (Δex) among the ferromagnetic layers in the memory layer 14 and the thermal stability index Δ.

In FIG. 9, a curve C61 shows the relationship between the Δex intensity and the thermal stability index Δ.

To provide the result shown in FIG. 9, Δ1 is fixed to 100 and Δ2 is fixed to −20, as in the case in FIG. 7.

Given Δex=0, Δ equals to Δ1. When Δex is equal to or higher than Δexmax, Δ equals to Δ1+Δ2.

The thermal stability index A is the index for showing the resistance of the memory element 3 to the thermal fluctuations. When it is used as the non-volatile memory, the information should not be lost during the operation guaranteed time. It indicates that the thermal stability index 4 should be above a predetermined value. The lower limit is within about 40 to 70, although it may be changed depending on the memory capacity and the operation guaranteed time.

As Δ increases, thermal tolerance increases. At the same time, writing energy is also increased. So, increasing more than necessary is wasteful.

Now, the designed value of the thermal stability index Δ is defined as Δ0.

Then, as shown in FIG. 9, the condition for providing Δ=Δ0 by adjusting Δex is Δ1+Δ2<Δ0<Δ1.

At the same indices of the thermal stability Δ, Δex of the three-layered configuration of the memory layer 14: a ferromagnetic layer/a binding layer/a ferromagnetic layer and Δex of the five-layered configuration according to the embodiment of the present technology were calculated. In this case, Δ1=200, Δ2=−300.

Then, in the three-layered configuration, Δex was 240.

On the other hand, in the five-layered configuration according to the embodiment of the present technology, Δex was 120.

Thus, according to the present technology, the same Δ can be obtained by the half of Δex, so that it is desirable when the magnitude of Δex is limited.

<4. Simulation Results>

Next, the spin injection magnetization switching was simulated as to the memory element 3 according to the embodiment as well as the memory element 3' in the related art for comparison.

Figure 10:
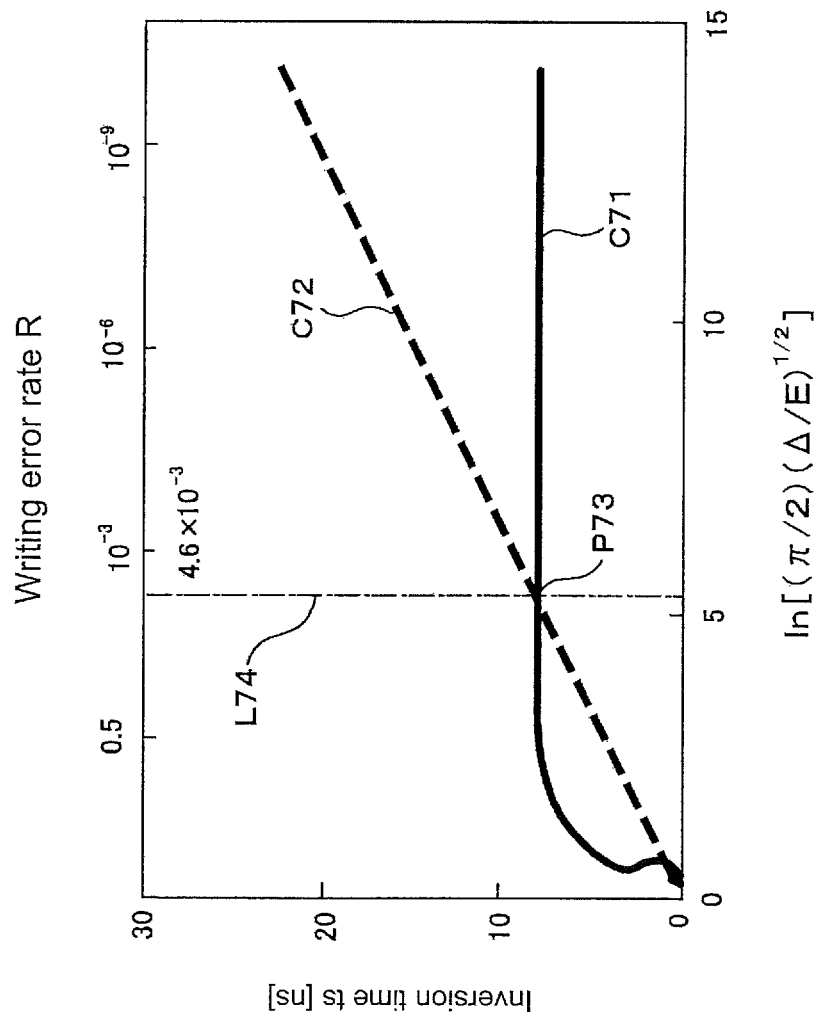
FIG. 10 is a plot of relationship among excitation energy, a writing error rate and a switching time.

FIG. 10 is a plot of relationship between the excitation energy E of the predetermined current and the switching time ts.

The abscissa axis is $\ln[(\pi/2)(\Delta/E)^{1/2}]$ according to [Equation 1]. Δ of the memory layer is 60.

The excitation energy E is calculated in the magnetization direction at the time of applying a current. The magnetization direction is deviated from the equilibrium state by the thermal fluctuations. It indicates that the higher the excitation energy E is (approaching to left in the graph in FIG. 10), the greater the deviation is.

In the memory element 3' in the related art, the relationship between the excitation energy E and the switching time ts is represented by [Equation 1].

A curve C72 in FIG. 10 represents the result of simulation.

When the abscissa axis is scaled logarithmically as the excitation energy E, the curve C72 becomes almost straight. It is found that the greater the excitation energy E is, the shorter the switching time is.

On the other hand, the relationship between the excitation energy E and the switching time ts in the memory element 3 according to the embodiment is represented by a curve C71 in FIG. 10.

Unlike the curve C72 by the memory element 3' in the related art, it can be confirmed that an increase of the switching time ts stops at about 8.2 ns, when the excitation energy E decreases. This is because the direction of the magnetization M1 is inclined from the perpendicular axis aV such that finite spin torque works, even if the excitation energy E is 0 (positive infinite at the abscissa axis in FIG. 10).

In the calculation sample as shown in the curve C71 in FIG. 10, the switching time ts is 8.2 ns at most. This means that the switching time ts does not exceed 8.2 ns at the time of applying a current even at any magnetization direction of the memory layer 14. In other words, within 8.2 ns of a current supply time (injection time), writing can be performed without generating the writing errors.

On the other hand, in the curve C72 by the memory element 3' in the related art, the switching time ts does not have the maximum value, and increases as the excitation energy E decreases. At the current supply time of 8.2 ns where writing can be performed without generating the writing errors in the memory element 3 according to the embodiment, the curve C72 passes through a point P73. At the point, the writing errors are determined to be $4.6 \times 10^{-3}$. Thus, in the memory element 3' in the related art, writing cannot be performed without generating the writing errors.

As understood from the above-described contrast, the memory element 3 according to the embodiment that the switching time ts is within a predetermined value even though the excitation energy E is so small is desirable to decrease the writing error rate.

At the same time, the memory element 3 according to the embodiment can write in a shorter time than the memory element 3' in the related art.

According to the memory element 3 according to the embodiment, the writing errors can be decreased effectively such that the reliability of the writing operation can be improved.

In addition, the writing operation can be performed in a shorter time such that the speed can be increased.

In summary, it can provide the memory element and the memory apparatus that has high reliability in the writing operation and operates at high speed.

<5. Alternative>

While the embodiments according to the present technology are described, it should be understood that the present technology is not limited to the illustrative embodiments described above.

For example, although the memory element has the laminated configuration that the magnetization-fixed layer 12, the intermediate layer 13, the memory layer 14 and the cap layer 15 (the perpendicular magnetic anisotropy inducing layer) are laminated on the underlying layer in the stated order, it is possible that the magnetization-fixed layer 12, the intermediate layer 13 and the memory layer 14 may be laminated upside down in the memory element according to the embodiment of the present technology.

The memory element 3 according to the embodiment of the present technology has a configuration of the magnetoresistive effect element such as a TMR element. The magnetoresistive effect element as the TMR element can be applied to a variety of electronic apparatuses, electric appliances and the like including a magnetic head, a hard disk drive equipped with the magnetic head, an integrated circuit chip, a personal computer, a portable terminal, a mobile phone and a magnetic sensor device as well as the above-described memory apparatus.

Figure 11A:
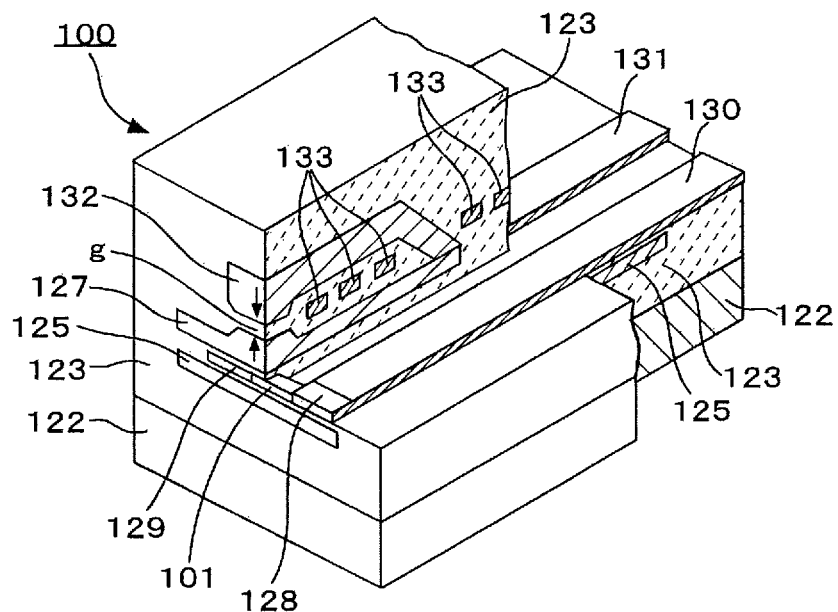
FIGS. 11A and 11B each show an application of a memory element (a magnetoresistive effect element) according to the embodiment to a composite magnetic head.
Figure 11B:
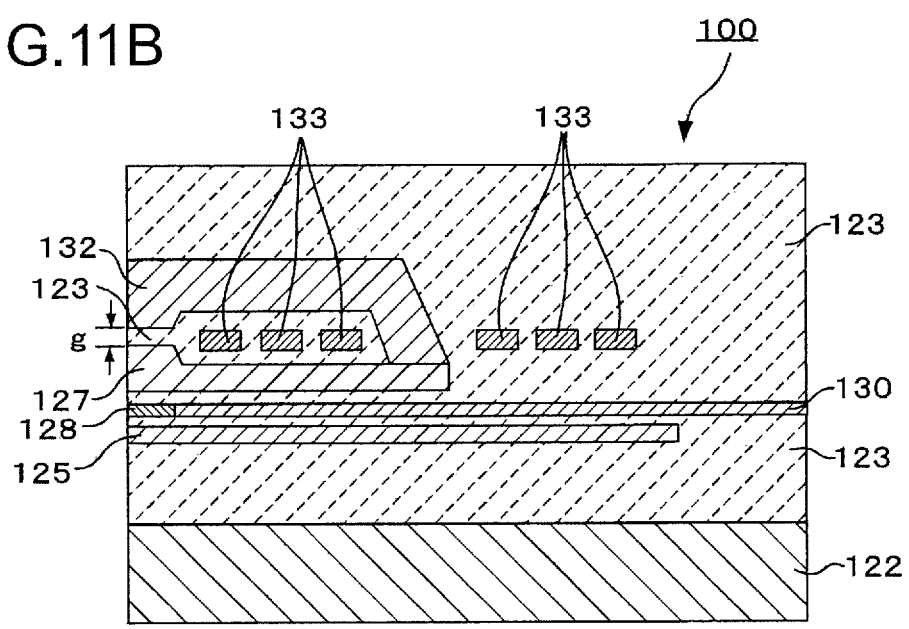

As an example, FIGS. 11A and 11B each show an application of a magnetoresistive effect element 101 having the configuration of the memory element 3 to a composite magnetic head 100. FIG. 11A is a perspective view shown by cutting some parts of the composite magnetic head 100 for discerning the internal configuration. FIG. 11B is a cross-sectional view of the composite magnetic head 100.

The composite magnetic head 100 is a magnetic head used for a hard disk apparatus or the like. On a substrate 122, the magnetoresistive effect magnetic head according to the embodiment of the present technology is formed. On the magnetoresistive effect magnetic head, an inductive magnetic head is laminated and thus the composite magnetic head 100 is formed. The magnetoresistive effect magnetic head functions as a reproducing head, and the inductive magnetic head functions as a recording head. In other words, the composite magnetic head 100 is configured by combining the reproducing head and the recording head.

The magnetoresistive effect magnetic head mounted on the composite magnetic head 100 is a so-called shielded MR head, and includes a first magnetic shield 125 formed on the substrate 122 via an insulating layer 123, the magnetoresistive effect element 101 formed on the first magnetic shield 125 via the insulating layer 123, and a second magnetic shield 127 formed on the magnetoresistive effect element 101 via the insulating layer 123. The insulating layer 123 includes an insulation material such as $Al_2O_3$ and $SiO_2$.

The first magnetic shield 125 is for magnetically shielding a lower side of the magnetoresistive effect element 101, and includes a soft magnetic material such as Ni—Fe. On the first magnetic shield 125, the magnetoresistive effect element 101 is formed via the insulating layer 123.

The magnetoresistive effect element 101 functions as a magnetosensitive element for detecting a magnetic signal from the magnetic recording medium in the magnetoresistive effect magnetic head. The magnetosensitive effect element 101 may have the similar film configuration (layer structure) to the above-described memory element 3.

The magnetoresistive effect element 101 is formed in an almost rectangular shape, and has one side that is exposed to an opposite surface of the magnetic recording medium. At both ends of the magnetoresistive effect element 101, bias layers 128 and 129 are disposed. Also, connection terminals 130 and 131 that are connected to the bias layers 128 and 129 are formed. A sense current is supplied to the magnetoresistive effect element 101 through the connection terminals 130 and 131.

Above the bias layers 128 and 129, the second magnetic shield 127 is disposed via the insulating layer 123.

The inductive magnetic head laminated and formed on the above-described magnetoresistive effect magnetic head includes a magnetic core including the second magnetic shield 127 and an upper core 132, and a thin film coil 133 wound around the magnetic core.

The upper core 132 forms a closed magnetic path together with the second magnetic shield 122, is to be the magnetic core of the inductive magnetic head, and includes a soft magnetic material such as Ni—Fe. The second magnetic shield 127 and the upper core 132 are formed such that front end portions of the second magnetic shield 127 and the upper core 132 are exposed to an opposite surface of the magnetic recording medium, and the second magnetic shield 127 and the upper core 132 come into contact with each other at back end portions thereof. The front end portions of the second magnetic shield 127 and the upper core 132 are formed at the opposite surface of the magnetic recording medium such that the second magnetic shield 127 and the upper core 132 are spaced apart by a predetermined gap g.

In other words, in the composite magnetic head 100, the second magnetic shield 127 not only magnetically shields the upper side of the magnetoresistive effect element 101, but functions as the magnetic core of the inductive magnetic head. The second magnetic shield 127 and the upper core 132 configure the magnetic core of the inductive magnetic head. The gap g is to be a recording magnetic gap of the inductive magnetic head.

In addition, above the second magnetic shield 127, thin film coils 133 buried in the insulation layer 123 are formed. The thin film coils 133 are formed to wind around the magnetic core including the second magnetic shield 127 and the upper core 132. Both ends (not shown) of the thin film coils 133 are exposed to the outside, and terminals formed on the both ends of the thin film coil 133 are to be outside connection terminals of the inductive magnetic head. In other words, when a magnetic signal is recorded on the magnetic recording medium, a recording current will be supplied from the outside connection terminals to the thin film coil 133.

As described above, the laminated configuration as the memory element according to the embodiment of the present technology can be applied to a reproducing head in the magnetic recording medium, i.e., a magnetosensitive element for detecting a magnetic signal from the magnetic recording medium.

The present technology may have the following configurations.

(1) A memory element having a layered configuration, including
a memory layer in which a magnetization direction is changed corresponding to information; the magnetization direction being changed by applying a current in a lamination direction of the layered configuration to record the information in the memory layer,
a magnetization-fixed layer in which a magnetization direction is fixed,
an intermediate layer that is formed of a non-magnetic material and is provided between the memory layer and the magnetization-fixed layer, and
a perpendicular magnetic anisotropy inducing layer,
the memory layer including a first ferromagnetic layer, a first bonding layer, a second ferromagnetic layer, a second bonding layer and a third ferromagnetic layer laminated in the stated order, the first ferromagnetic layer is contacted with the intermediate layer, the third ferromagnetic layer is contacted with the perpendicular magnetic anisotropy inducing layer, the ferromagnetic layers adjacent via the bonding layers are magnetically coupled via the bonding layers so that the magnetization direction of the ferromagnetic layer is inclined from a direction perpendicular to a film face.

(2) The memory element according to (1) above, in which
an easy axis of magnetization of the first ferromagnetic layer is perpendicular to a film face,
an easy axis of magnetization of the second ferromagnetic layer is within the film face,
an easy axis of magnetization of the third ferromagnetic layer is perpendicular to the film face.

(3) The memory element according to [1] or [2] above, in which
the intermediate layer and the perpendicular magnetic anisotropy inducing layer are composed of an oxide.

(4) The memory element according to any one of [1] to [3] above, in which
a first magnetic energy of the first ferromagnetic layer is defined by subtracting magnetic energy when the magnetization of the first ferromagnetic layer is perpendicular to the film face from magnetic energy when magnetization of the first ferromagnetic layer is within the film face,
a second magnetic energy of the second ferromagnetic layer is defined by subtracting magnetic energy when the magnetization of the second ferromagnetic layer is perpendicular to the film face from magnetic energy when magnetization of the second ferromagnetic layer is within the film face, a third magnetic energy of the third ferromagnetic layer is defined by subtracting magnetic energy when the magnetization of the third ferromagnetic layer is perpendicular to the film face from magnetic energy when magnetization of the third ferromagnetic layer is within the film face, and a sign of the second magnetic energy is different from those of the first magnetic energy and the third magnetic energy.

(5) The memory element according to [4] above, in which magnetic binding energy between the first ferromagnetic layer and the second magnetic layer via the first binding layer is defined as a first interlayer magnetic binding energy, magnetic binding energy between the second ferromagnetic layer and the third magnetic layer via the second binding layer is defined as a second interlayer magnetic binding energy, an absolute value of the first interlayer magnetic binding energy is smaller than an absolute value obtained by dividing a product of the first magnetic energy and the second magnetic energy by a sum of the first magnetic energy and the second magnetic energy, and an absolute value of the second interlayer magnetic binding energy is smaller than an absolute value obtained by dividing a product of the second magnetic energy and the third magnetic energy by a sum of the second magnetic energy and the third magnetic energy.

(6) A memory apparatus including
a memory element having a layered configuration, including
a memory layer in which a magnetization direction is changed corresponding to information; the magnetization direction being changed by applying a current in a lamination direction of the layered configuration to record the information in the memory layer,
a magnetization-fixed layer in which a magnetization direction is fixed,
an intermediate layer that is formed of a non-magnetic material and is provided between the memory layer and the magnetization-fixed layer, and
a perpendicular magnetic anisotropy inducing layer,
the memory layer including a first ferromagnetic layer, a first bonding layer, a second ferromagnetic layer, a second bonding layer and a third ferromagnetic layer laminated in the stated order, the first ferromagnetic layer is contacted with the intermediate layer, the third ferromagnetic layer is contacted with the perpendicular magnetic anisotropy inducing layer, the ferromagnetic layers adjacent via the bonding layers are magnetically coupled via the bonding layers so that the magnetization direction of the ferromagnetic layer is inclined from a direction perpendicular to a film face,
an interconnection that supplies a current flowing from the lamination direction to the memory apparatus, and
a current supply controller that controls the supply of current to the memory apparatus via the interconnection.

The present technology contains subject matter related to that disclosed in Japanese Priority Patent Application JP 2011-261521 filed in the Japan Patent Office on Nov. 30, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A memory element having a layered configuration, comprising:
a memory layer in which a magnetization direction is changed corresponding to information; the magnetization direction being changed by applying a current in a lamination direction of the layered configuration to record the information in the memory layer,
a magnetization-fixed layer in which a magnetization direction is fixed,
an intermediate layer that is formed of a non-magnetic material and is provided between the memory layer and the magnetization-fixed layer, and
a perpendicular magnetic anisotropy inducing layer,
the memory layer including a first ferromagnetic layer, a first bonding layer, a second ferromagnetic layer, a second bonding layer and a third ferromagnetic layer laminated in the stated order, the first ferromagnetic layer is contacted with the intermediate layer, the third ferromagnetic layer is contacted with the perpendicular magnetic anisotropy inducing layer, the ferromagnetic layers adjacent via the bonding layers are magnetically coupled via the bonding layers so that magnetization direction of the ferromagnetic layer is inclined from a direction perpendicular to a film face.

2. The memory element according to claim 1, wherein
an easy axis of magnetization of the first ferromagnetic layer is perpendicular to a film face,
an easy axis of magnetization of the second ferromagnetic layer is within the film face,
an easy axis of magnetization of the third ferromagnetic layer is perpendicular to the film face.

3. The memory element according to claim 1, wherein
the intermediate layer and the perpendicular magnetic anisotropy inducing layer are composed of an oxide.

4. The memory element according to claim 1, wherein
a first magnetic energy of the first ferromagnetic layer is defined by subtracting magnetic energy when the magnetization of the first ferromagnetic layer is perpendicular to the film face from magnetic energy when magnetization of the first ferromagnetic layer is within the film face,
a second magnetic energy of the second ferromagnetic layer is defined by subtracting magnetic energy when the magnetization of the second ferromagnetic layer is perpendicular to the film face from magnetic energy when magnetization of the second ferromagnetic layer is within the film face,
a third magnetic energy of the third ferromagnetic layer is defined by subtracting magnetic energy when the magnetization of the third ferromagnetic layer is perpendicular to the film face from magnetic energy when magnetization of the third ferromagnetic layer is within the film face, and
a sign of the second magnetic energy is different from those of the first magnetic energy and the third magnetic energy.

5. The memory element according to claim 4, wherein
magnetic binding energy between the first ferromagnetic layer and the second magnetic layer via the first binding layer is defined as a first interlayer magnetic binding energy,
magnetic binding energy between the second ferromagnetic layer and the third magnetic layer via the second binding layer is defined as a second interlayer magnetic binding energy,
an absolute value of the first interlayer magnetic binding energy is smaller than an absolute value obtained by dividing a product of the first magnetic energy and the second magnetic energy by a sum of the first magnetic energy and the second magnetic energy, and an absolute value of the second interlayer magnetic binding energy is smaller than an absolute value obtained by dividing a product of the second magnetic energy and the third magnetic energy by a sum of the second magnetic energy and the third magnetic energy.

6. A memory apparatus including a memory element having a layered configuration, including a memory layer in which a magnetization direction is changed corresponding to information; the magnetization direction being changed by applying a current in a lamination direction of the layered configuration to record the information in the memory layer, a magnetization-fixed layer in which a magnetization direction is fixed, an intermediate layer that is formed of a non-magnetic material and is provided between the memory layer and the magnetization-fixed layer, and a perpendicular magnetic anisotropy inducing layer, the memory layer including a first ferromagnetic layer, a first bonding layer, a second ferromagnetic layer, a second bonding layer and a third ferromagnetic layer laminated in the stated order, the first ferromagnetic layer is contacted with the intermediate layer, the third ferromagnetic layer is contacted with the perpendicular magnetic anisotropy inducing layer, the ferromagnetic layers adjacent via the bonding layers are magnetically coupled via the bonding layers so that the magnetization direction of the ferromagnetic layer is inclined from a direction perpendicular to a film face;

an interconnection that supplies a current flowing from the lamination direction to the memory apparatus; and a current supply controller that controls the supply of current to the memory apparatus via the interconnection.

* * * * *